United States Patent
Yu

(10) Patent No.: US 11,058,024 B2
(45) Date of Patent: Jul. 6, 2021

(54) ROTARY EXTENDING FRAME

(71) Applicant: Wei-Cheng Yu, Taipei (TW)

(72) Inventor: Wei-Cheng Yu, Taipei (TW)

(73) Assignee: COMPAL ELECTRONICS, INC., Taipei (TW)

(*) Notice: Subject to any disclaimer, the term of this patent is extended or adjusted under 35 U.S.C. 154(b) by 15 days.

(21) Appl. No.: 16/745,283

(22) Filed: Jan. 16, 2020

(65) Prior Publication Data

US 2021/0092861 A1 Mar. 25, 2021

(30) Foreign Application Priority Data

Sep. 25, 2019 (TW) .................................. 108134616

(51) Int. Cl.
*A47B 96/00* (2006.01)
*H05K 7/14* (2006.01)
*F16M 13/02* (2006.01)

(52) U.S. Cl.
CPC ......... *H05K 7/1489* (2013.01); *F16M 13/022* (2013.01); *F16M 2200/024* (2013.01)

(58) Field of Classification Search
CPC .. H05K 7/1489; H05K 7/1487; H05K 7/1411; F16M 13/022; F16M 2200/024
USPC ................ 248/205.1, 220.22, 222.52, 274.1; 361/679.32, 679.33, 679.37, 679.41, 361/679.44, 755, 724, 727, 728
See application file for complete search history.

(56) References Cited

U.S. PATENT DOCUMENTS

| | | | | | |
|---|---|---|---|---|---|
| 5,481,431 | A | * | 1/1996 | Siahpolo | G06F 1/184 361/679.31 |
| 7,460,365 | B2 | * | 12/2008 | Morris | G06F 1/187 361/679.33 |
| 8,644,017 | B2 | * | 2/2014 | Dunham | H05K 5/023 361/679.33 |
| 9,699,931 | B1 | * | 7/2017 | Chen | H05K 7/1489 |
| 9,826,658 | B1 | * | 11/2017 | Mao | H05K 7/1487 |
| 10,061,362 | B2 | * | 8/2018 | Jau | H05K 7/1487 |
| 10,104,803 | B1 | * | 10/2018 | Lin | H05K 7/18 |
| 10,251,300 | B1 | * | 4/2019 | Mao | H05K 7/1489 |

(Continued)

FOREIGN PATENT DOCUMENTS

| | | |
|---|---|---|
| CN | 102480882 | 5/2012 |
| TW | I488180 | 6/2015 |

*Primary Examiner* — Todd M Epps
(74) *Attorney, Agent, or Firm* — JCIPRNET

(57) ABSTRACT

A rotary extending frame includes a frame, a handle, a plurality of friction pieces, and a plurality of positioning discs. The frame has a plurality of accommodation spaces and fastening portions. The handle is rotatably disposed on the frame and has a holding portion and a plurality of rotating portions connected to two ends of the holding portion and facing two side surfaces of the frame respectively. The friction pieces are disposed on the corresponding rotating portions respectively and are firmly attached on the two side surfaces. The positioning discs are disposed on the corresponding rotating portions respectively and are pivotally connected to the friction pieces. The friction pieces and the frame clamp the corresponding rotating portions, so that the rotating portions and the positioning discs are adapted to rotate relative to the friction pieces and the frame and rub against the corresponding friction pieces simultaneously.

10 Claims, 6 Drawing Sheets

(56) References Cited

U.S. PATENT DOCUMENTS

| | | | |
|---|---|---|---|
| 2004/0017650 A1* | 1/2004 | Liu | G06F 1/184 |
| | | | 361/679.33 |
| 2011/0273850 A1* | 11/2011 | Chen | H05K 5/023 |
| | | | 361/726 |
| 2015/0192970 A1 | 7/2015 | Jau et al. | |

* cited by examiner

ROTARY EXTENDING FRAME

CROSS-REFERENCE TO RELATED APPLICATION

This application claims the priority benefit of Taiwan application serial no. 108134616, filed on Sep. 25, 2019. The entirety of the above-mentioned patent application is hereby incorporated by reference herein and made a part of this specification.

BACKGROUND OF THE INVENTION

1. Field of the Invention

The invention relates to an extending frame, in particular, to a rotary extending frame for carrying hard disks.

2. Description of Related Art

A server is a core computer serving computers or portable electronic devices in a network system, is capable of providing functions required by network users such as hard disks or printing services, and is also available for clients to share various resources in the network environment. In order to store a great amount of data, the server needs to be configured with a plurality of hard disk modules.

A large chassis is adopted in the prior art. A plurality of hard disk modules are respectively installed in a plurality of extending areas of a chassis structure and then are connected to the server as data storage units. The extending areas are arranged in sequence or are adjacent to one another. When one of the extending areas needs to be repaired or replaced, all extending areas must be disassembled and separated one by one, which is not conducive to the repair or replacement.

SUMMARY OF THE INVENTION

The invention provides a rotary extending frame, which is capable of providing a simple way to repair or replace electronic modules installed inside and capable of avoiding collision damage of the rotary extending frame.

The rotary extending frame of the invention is suitable for being disposed in a chassis. The rotary extending frame includes a frame, a handle, a plurality of friction pieces and a plurality of positioning discs. The frame has a plurality of accommodation spaces and a plurality of fastening portions. The accommodation spaces are suitable for carrying electronic modules. The handle is rotatably disposed on the frame and has a holding portion and a plurality of rotating portions. The rotating portions are connected to two ends of the holding portion and face two side surfaces of the frame respectively. The friction pieces are disposed on the corresponding rotating portions respectively and are firmly attached on the two side surfaces. The positioning discs are disposed on the corresponding rotating portions respectively and are pivotally connected to the friction pieces. The friction pieces and the frame clamp the corresponding rotating portions, so that the rotating portions and the positioning discs are adapted to rotate relative to the friction pieces and the frame, and the rotating portions and the positioning discs rub against the corresponding friction pieces simultaneously.

Based on the above, the rotary extending frame of the invention is suitable for being disposed in the chassis of the server. Through the driving of the handle, the rotary extending frame may rotate relative to a chassis body, and the accommodation spaces of the frame can be lifted upwards without being blocked, so that the electronic modules installed in the accommodation spaces of the frame can be conveniently repaired or replaced by users. Furthermore, each handle of the invention is clamped by each friction piece and the frame. When the handle rotates relative to the frame, the rotating portions, the positioning discs and the friction pieces produce bidirectional contact friction, so that the rotation speed can be reduced when the frame rotationally drops down, and thus the collision damage of the rotary extending frame and the chassis can be avoided.

To make the features and advantages of the invention clear and easy to understand, the following gives a detailed description of embodiments with reference to accompanying drawings.

DESCRIPTION OF THE EMBODIMENTS

Figure 1A:
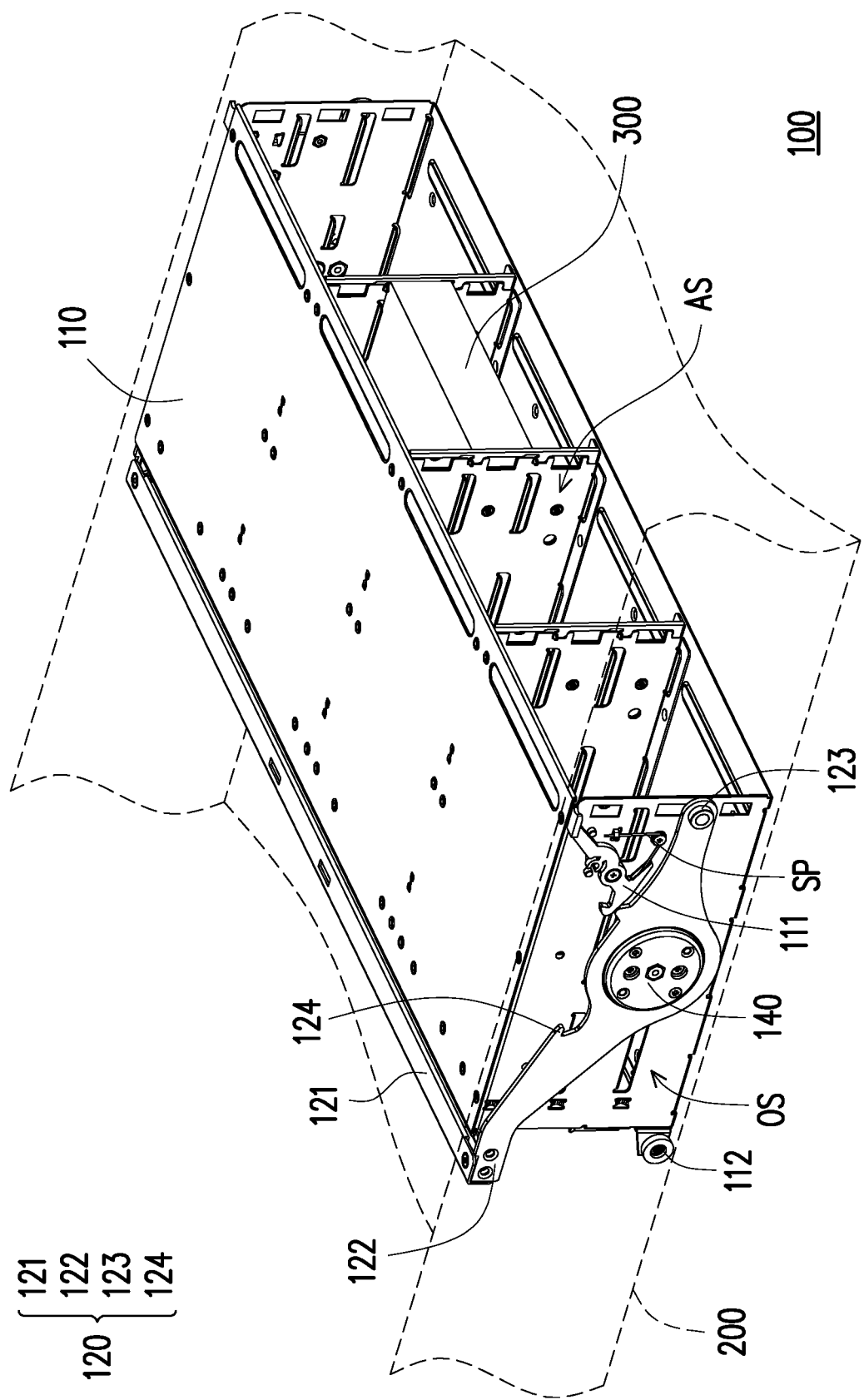
FIG. 1A is a schematic stereoscopic view of a rotary extending frame in a storage mode according to an embodiment of the invention.
Figure 1B:
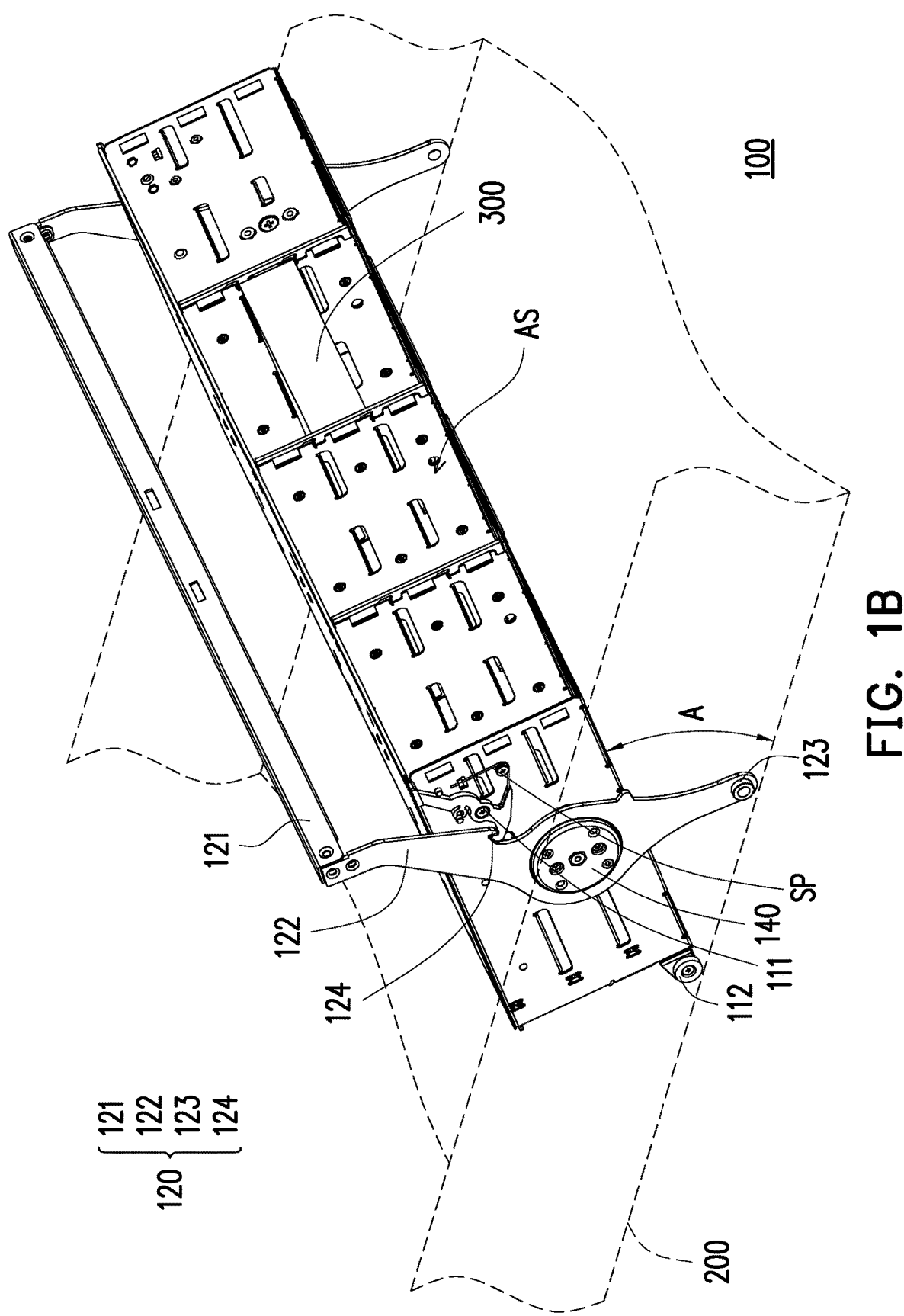
FIG. 1B is a schematic stereoscopic view of the rotary extending frame of FIG. 1A in a lifting mode.
Figure 1C:
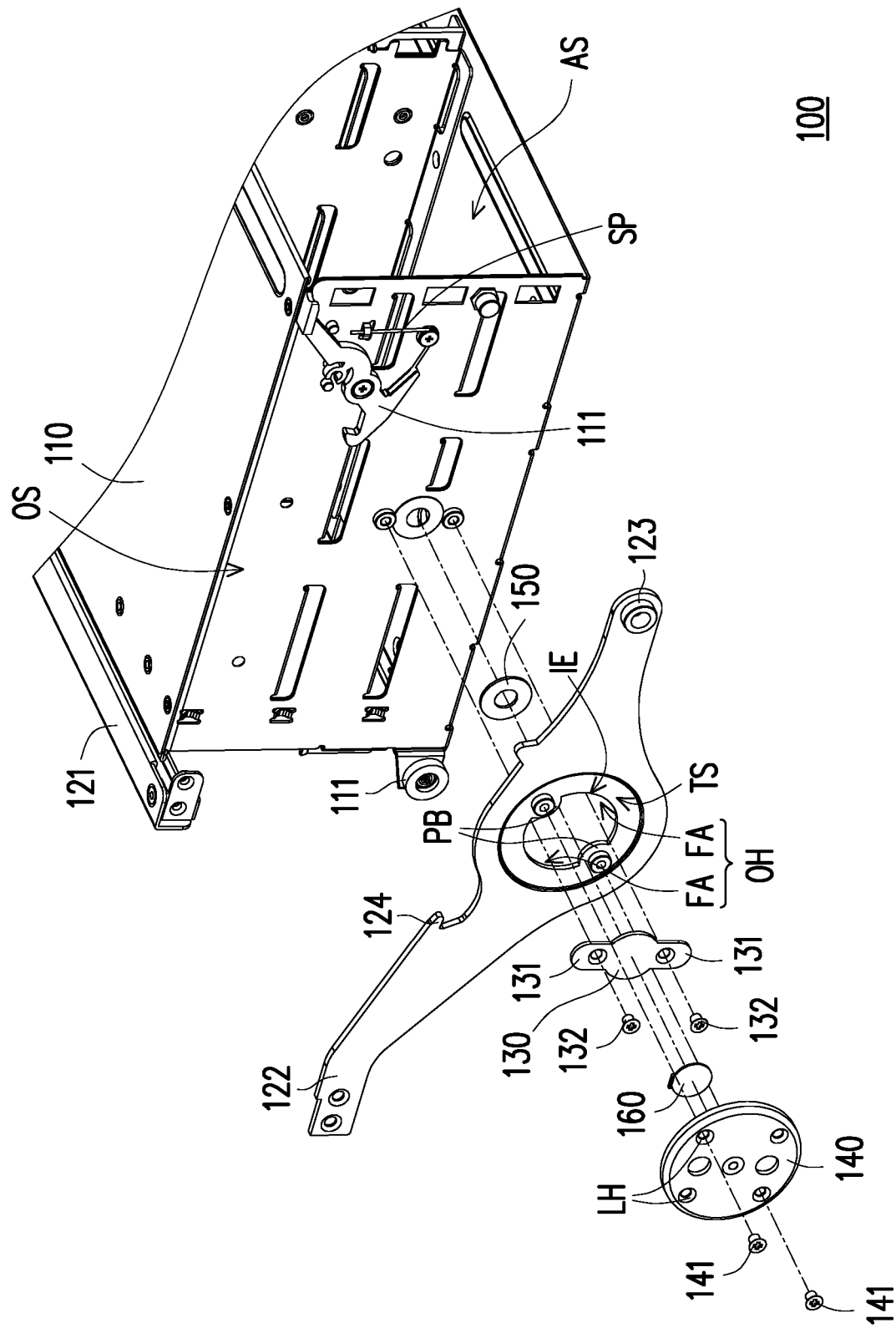
FIG. 1C is a schematic exploded stereoscopic view of components of the rotary extending frame of FIG. 1A.

FIG. 1A is a schematic stereoscopic view of a rotary extending frame in a storage mode according to an embodiment of the invention. FIG. 1B is a schematic stereoscopic view of the rotary extending frame of FIG. 1A in a lifting mode. FIG. 1C is a schematic exploded stereoscopic view of components of the rotary extending frame of FIG. 1A.

Referring to FIG. 1A and FIG. 1B, the rotary extending frame 100 of the invention is suitable for being disposed in a chassis 200 of a server. As shown in FIG. 1A and FIG. 1B, only a single rotary extending frame 100 is disposed in the chassis 200, and only one electronic module 300 is shown in the rotary extending frame 100. In actual use, a plurality of rotary extending frames 100 may be installed in the chassis 200. A plurality of electronic modules 300 may be disposed in each rotary extending frame 100, which depends on the requirements of users or servers. In the invention, the electronic module 300, for example, is a hard disk module, a power supply module or a heat dissipation module. The invention does not limit the number of the rotary extending frames 100 and the number of the electronic modules 300.

In other embodiments, the rotary extending frame 100 may be applied to other suitable types of devices and is not limited to the server. The electronic module 300 may also be other electronic components, and the invention is not limited thereto.

Referring to FIG. 1A to FIG. 1C, the rotary extending frame 100 includes a frame 110, a handle 120, a plurality of friction pieces 130 and a plurality of positioning discs 140.

The frame 110 has a plurality of accommodation spaces AS and a plurality of fastening portions 111. The accommodation spaces AS are linearly arranged at intervals. Each accommodation space AS is suitable for carrying at least one electronic module 300. The fastening portions 111 (two fastening portions are shown in FIG. 1A) are respectively disposed on two opposite side surfaces OS of the frame 110. Further, each fastening portion 111, for example, is pivotally connected to the corresponding side surface OS and abutted against and supported by a compression elastic piece SP.

The handle 120 is rotatably disposed on the frame 110 and has a holding portion 121 and a plurality of rotating portions 122 (two rotating portions are shown in FIG. 1B). The holding portion 121 is disposed outside the frame 110 in a spacing manner and is adapted to move outside the frame 110 without being blocked. The rotating portions 122 are connected to two ends of the holding portion 121 and face two side surfaces OS of the frame 110 respectively.

The friction pieces 130 are disposed on the corresponding rotating portions 122 respectively and are firmly attached on the two side surfaces OS of the frame 110. Specifically, the friction pieces 130 and the frame 110 are connected into a whole and clamp the corresponding rotating portions 122 of the handle 120. The friction pieces 130, for example, are made of flexible materials, and materials with different friction coefficients and flexibility are also used according to the requirements. The positioning discs 140 are disposed on the corresponding rotating portions 122 respectively and are pivotally connected to the friction pieces 130, which indicates that each positioning disc 140 is connected with each rotating portion 122 respectively into a whole and bidirectionally contacts the corresponding friction piece 130.

Referring to FIG. 1C, in the present embodiment, each positioning disc 140 has a plurality of lock holes LH and a plurality of locking pieces 141. The locking pieces 141 are disposed in the lock holes LH in a penetrating manner and firmly locked to the corresponding rotating portion 122, so that the positioning discs 140 and the rotating portions 122 are connected into a whole.

In brief, the friction pieces 130 and the frame 110 clamp the corresponding rotating portions 122, so that the rotating portions 122 and the positioning discs 140 are adapted to rotate relative to the friction pieces 130 and the frame 110, and the rotating portions 122 and the positioning discs 140 rub against the corresponding friction pieces 130 simultaneously.

Here when the frame 110 is lifted or dropped by a user through the holding portion 121, the rotating portions 122 and the positioning discs 140 rub against the corresponding friction pieces 130 simultaneously, so that the lifting speed or dropping speed of the frame 110 can be reduced by a frictional force. When the frame 110 is lifted, a user can achieve an effect of applying force by section with the help of the frictional force, so that the applied force can be saved. When being dropped, the frame 110 can be dropped slowly through the frictional force, so that the damage caused by direct collision between the frame 110 and the chassis 200 can be avoided.

Referring to FIG. 1A to FIG. 1C, each rotating portion 122 has a step surface TS, a track through hole OH and two limiting blocks PB. The step surface TS is concavely formed on an outer side, away from each side surface OS, of each rotating portion 122. The outer diameter of the step surface TS corresponds to the outer diameter of each positioning disc 140, so that the positioning disc 140 is suitable for being disposed on the step surface TS. The step surface TS has a height difference relative to other parts of the rotating portions 122, so that the positioning discs 140 can be prevented from moving in the radial direction.

The track through hole OH runs through the step surface TS. Each friction piece 130 is disposed on the corresponding step surface TS and partially suspended in the track through hole OH. The two limiting blocks PB are disposed on an inner edge IE of the step surface TS and extend oppositely into the track through hole OH, thereby dividing the track through hole into two sector areas FA.

Further, each friction piece 130 has two non-slip portions 131 and two guiding columns 132. The two non-slip portions 131 extend outwards in the radial direction and are in surface contact with each step surface TS. Each guiding column 132 is respectively disposed on the non-slip portion 131 in a penetrating manner, and runs through the track through hole OH to be firmly attached on the corresponding side surface OS of the frame 110. The two guiding columns 132 abut against the inner edge IE of the step surface TS and are respectively located on the two limiting blocks PB. The above description shows that the two guiding columns 132 are respectively located in the two sector areas FA of the track through hole OH and limited by the two limiting blocks PB.

Further, the frame 110 has a plurality of first linkage portions 112 (only one is shown in the figure) disposed at intervals. A second linkage portion 123 is formed on each rotating portion 122 of the handle 120. When the rotating portions 122 rotate towards the fastening portions 111, each second linkage portion 123 is separated from the frame 110 without being overlapped. Each second linkage portion 123 is relatively close to each first linkage portion 112, so that the frame 110 forms an angle A with the chassis 200. Further, the height of the accommodation spaces AS of the frame 110 relative to a horizontal plane is greater than the height of the chassis 200 relative to the horizontal plane, which is conducive to disassembly or replacement of the electronic modules 300 in the frame 110.

Further, a bump 124 is formed at each rotating portion 122 of the handle 120. When the rotating portions 122 rotate towards the fastening portions 111, each bump 124 is adapted to buckle the corresponding fastening portion 111 so as to fix a lifting mode of the frame 110.

Referring to FIG. 1C, the rotary extending frame 100 has a plurality of elastic rings 150 and a plurality of gaskets 160. The elastic rings 150 are respectively disposed on two side surfaces OS of the frame 110. Each elastic ring 150 is located in the corresponding track through hole OH to support part of the friction pieces 130 suspended in the track through hole OH, so that the friction pieces 130 may be prevented from being deformed in the lifting and dropping process. The gaskets 160 are respectively disposed between the corresponding friction pieces 130 and positioning discs 140 to form a gap between each friction piece 130 and each positioning disc 140, so that the friction pieces 130 can be prevented from losing a deceleration effect due to excessive abrasion.

Figure 2A:
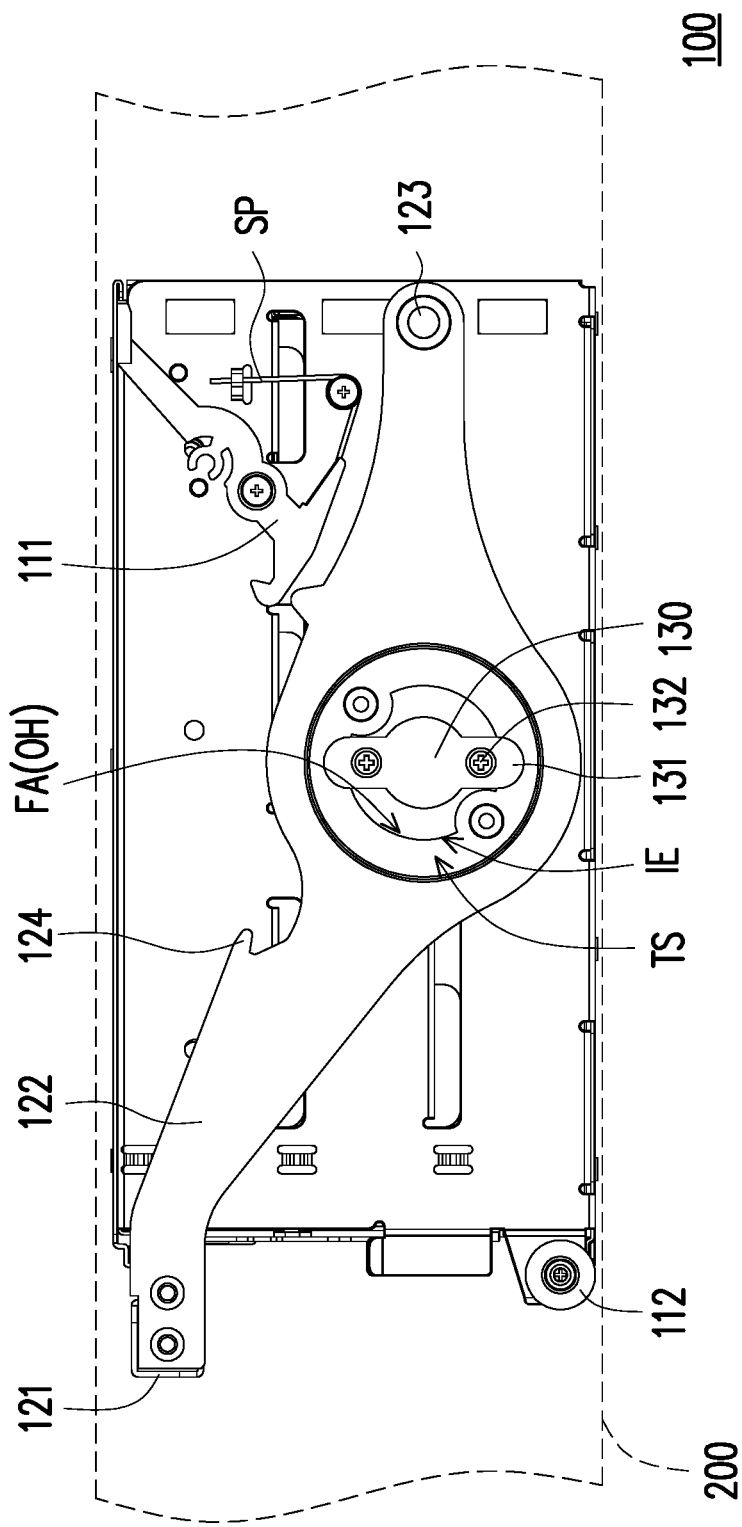
FIG. 2A to FIG. 2C are schematic views of movement of a lifting process of the rotary extending frame of FIG. 1A relative to a chassis.
Figure 2B:
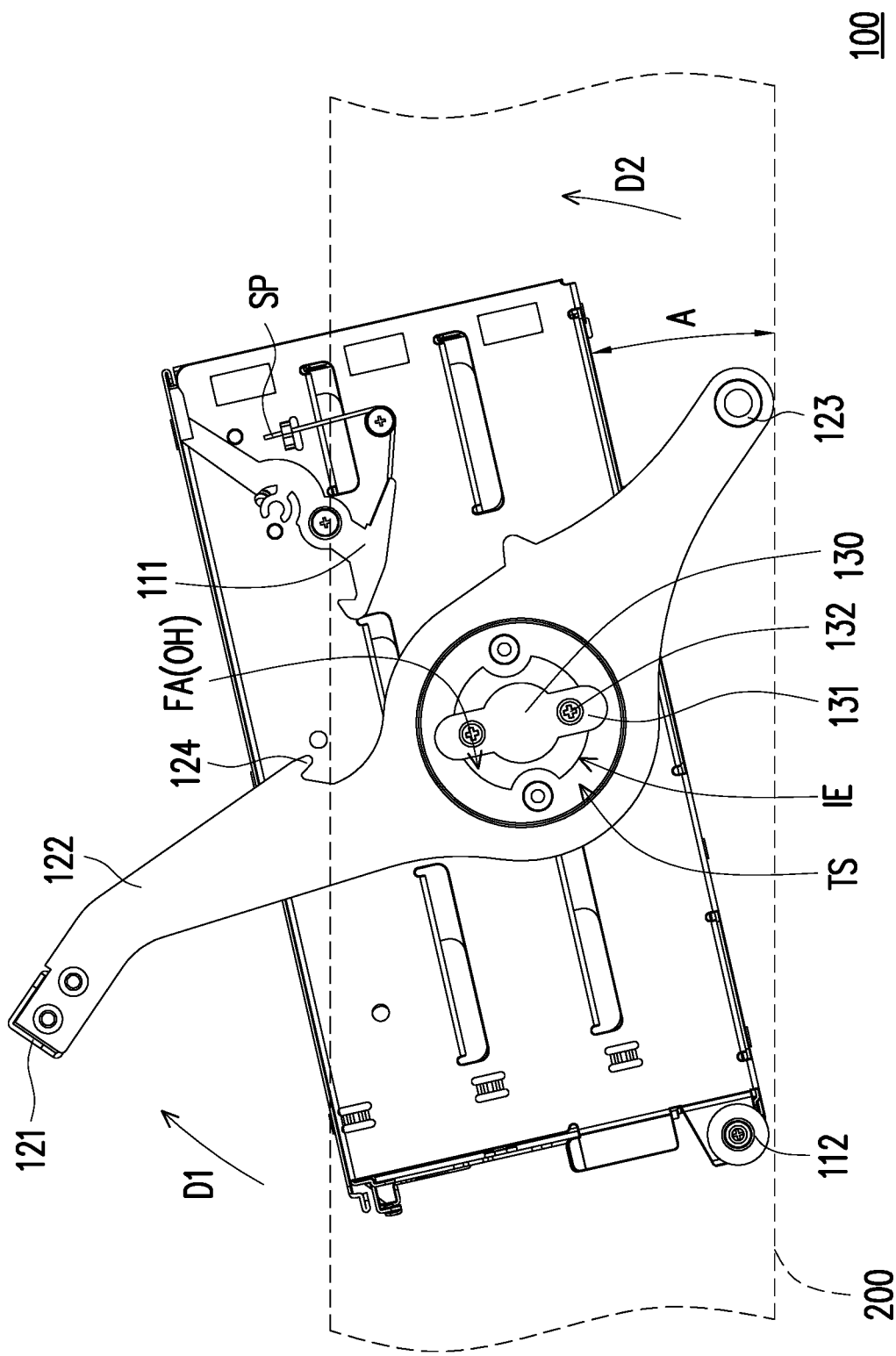
Figure 2C:
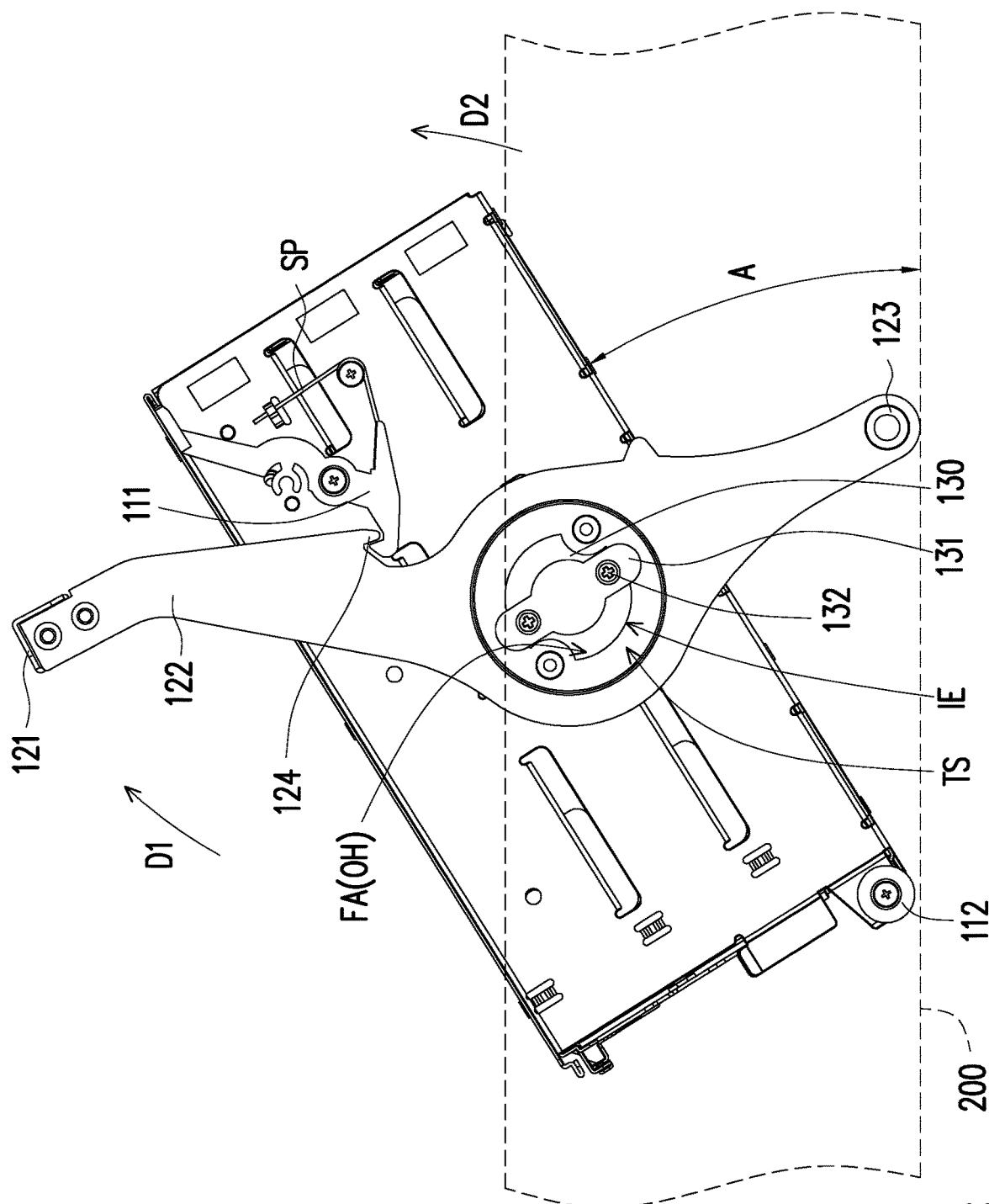

FIG. 2A to FIG. 2C are schematic views of movement of a lifting process of the rotary extending frame of FIG. 1A relative to a chassis. The lifting process of the rotary extending frame 100 relative to the chassis 200 is described below.

Referring to FIG. 1A and FIG. 2A, the rotary extending frame 100 is in a dropping state, that is, the frame 110 lies in the chassis 200 and is parallel to the horizontal plane. Referring to FIG. 2B, when a user wants to lift the frame 110 relative to the chassis 200, the user first pushes the holding portion 121 of the handle 120 in a first rotating direction D1 to rotate relative to the frame 110, and at the same time, the rotating portions 122 of the handle 120 protrude out of the frame 110, and the second linkage portions 123 abut against the bottom of the chassis 200 to lift the frame 110 upwards. The two guiding columns 132 of the friction piece 130 make relative movement respectively along tracks of the two sector areas FA of the track through hole OH. The frame 110 is gradually lifted upwards in a second rotating direction D2 by taking the first linkage portion 112 as a pivot point, and the frame 110 forms an angle A with the bottom of the chassis 200.

Referring to FIG. 2C, when the user continuously applies the force to the handle 120, the bump 124 on each rotating portion 122 pushes against the corresponding fastening portion 111, so that the fastening portions 111 pivot relative to the side surface OS of the frame 110. At the same time, the compression elastic piece SP is pressed by the fastening portions 111 to produce elastic deformation and to accumulate the elastic force. When the bumps 124 enter the fastening portions 111, the fastening portions 111 are released, and the compression elastic piece SP releases the elastic force to push the fastening portions 111 to pivot to an original position, so that the fastening portions 111 and the bumps 124 are mutually buckled, and the rotary extending frame 100 is further kept in the lifting mode relative to the chassis 200.

Referring to FIG. 2A to FIG. 2C, when the user wants to release the lifting mode of the rotary extending frame 100, the holding portion 121 of the handle 120 is driven in a second rotating direction D2 to rotate relative to the frame 110. At the same time, the rotating portions 122 of the handle 120 are gradually sunken into the frame 110, and the two guiding columns 132 of the friction piece 130 make relative movement in opposite directions respectively along the two sector areas FA of the track through hole OH. The frame 110 is gradually dropped in the first rotating direction D1 by taking the first linkage portion 112 as a pivot point, and the angle A between the frame 110 and the chassis 200 is gradually reduced to 0, so that the frame is switched to a storage mode.

Based on the above, the rotary extending frame of the invention is suitable for being disposed in the chassis of the server. Under the driving of the handle, the rotary extending frame may rotate relative to the chassis, and the accommodation spaces of the frame can be lifted without being blocked, so that the electronic modules installed in the accommodation spaces of the frame are conveniently repaired or replaced by the user. Furthermore, each handle of the invention is clamped by each friction piece and the frame. When the handle rotates relative to the frame, the rotating portions, the positioning discs and the friction pieces produce bidirectional contact friction, so that the rotation speed can be reduced when the frame rotationally drops down, and the collision damage of the rotary extending frame and the chassis can be avoided.

Although the invention is described with reference to the above embodiments, the embodiments are not intended to limit the invention. A person of ordinary skill in the art may make variations and modifications without departing from the spirit and scope of the invention. Therefore, the protection scope of the invention should be subject to the appended claims.

What is claimed is:

1. A rotary extending frame, suitable for being disposed in a chassis, the rotary extending frame comprising:
   a frame comprising a plurality of accommodation spaces and a plurality of fastening portions, wherein the accommodation spaces are suitable for carrying electronic modules;
   a handle rotatably disposed on the frame and comprising a holding portion; and
   a plurality of rotating portions, connected to two ends of the holding portion and faced two side surfaces of the frame respectively;
   a plurality of friction pieces disposed on the corresponding rotating portions respectively and firmly attached on the two side surfaces; and
   a plurality of positioning discs disposed on the corresponding rotating portions respectively and pivotally connected to the friction pieces,
   wherein the friction pieces and the frame clamp the corresponding rotating portions, so that the rotating portions and the positioning discs are adapted to rotate relative to the friction pieces and the frame, and the rotating portions and the positioning discs rub against the corresponding friction pieces simultaneously.

2. The rotary extending frame according to claim 1, wherein each of the rotating portions has a step surface and a track through hole, the track through hole runs through the step surface, and the friction pieces are disposed on the step surfaces and partially suspended in the track through holes.

3. The rotary extending frame according to claim 2, wherein each of the friction pieces has two non-slip portions, and the non-slip portions extend outwards in a radial direction and are in surface contact with the corresponding step surfaces.

4. The rotary extending frame according to claim 2, wherein each of the friction pieces has two guiding columns, each of the guiding columns runs through the track through hole to be firmly attached on the frame, and the guiding columns abut against inner edges of the corresponding step surfaces.

5. The rotary extending frame according to claim 2, wherein each of the rotating portions has two limiting blocks disposed on an inner edge of each of the step surfaces and extending oppositely into the track through hole.

6. The rotary extending frame according to claim 1, wherein the frame has a plurality of first linkage portions disposed at intervals, each of the rotating portions is provided with a second linkage portion, and when the rotating portions rotate towards the fastening portions, the second linkage portions are separated from the frame without being overlapped, and the second linkage portions are relatively close to the first linkage portions.

7. The rotary extending frame according to claim 1, wherein each of the rotating portions of the handle is provided with a bump, and when the rotating portions rotate towards the fastening portions, the bumps are adapted to buckle the corresponding fastening portions.

8. The rotary extending frame according to claim 1, wherein the rotary extending frame further comprises a plurality of elastic rings disposed on the side surfaces of the frame respectively, and the elastic rings are located in the corresponding track through holes to support part of the friction pieces.

9. The rotary extending frame according to claim 1, wherein the rotary extending frame further comprises a plurality of gaskets respectively disposed between the corresponding friction pieces and the positioning discs.

10. The rotary extending frame according to claim 1, wherein each of the positioning discs has a plurality of lock holes and a plurality of locking pieces, and the locking pieces are disposed in the lock holes in a penetrating manner and firmly locked to the rotating portions, so that the positioning discs and the rotating portions are integrally connected.

* * * * *